United States Patent
Cho et al.

(10) Patent No.: US 9,899,410 B1
(45) Date of Patent: Feb. 20, 2018

(54) CHARGE STORAGE REGION IN NON-VOLATILE MEMORY

(71) Applicant: SanDisk Technologies LLC, Plano, TX (US)

(72) Inventors: Hoon Cho, Sunnyvale, CA (US); Jun Wan, San Jose, CA (US); Ching-Huang Lu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/376,925

(22) Filed: Dec. 13, 2016

(51) Int. Cl.
| | |
|---|---|
| *H01L 29/792* | (2006.01) |
| *H01L 31/119* | (2006.01) |
| *H01L 27/11582* | (2017.01) |
| *H01L 27/11556* | (2017.01) |
| *H01L 29/40* | (2006.01) |
| *H01L 29/423* | (2006.01) |
| *H01L 29/788* | (2006.01) |

(52) U.S. Cl.
CPC .. *H01L 27/11582* (2013.01); *H01L 27/11556* (2013.01); *H01L 29/408* (2013.01); *H01L 29/42328* (2013.01); *H01L 29/42344* (2013.01); *H01L 29/788* (2013.01); *H01L 29/792* (2013.01)

(58) Field of Classification Search
CPC ......... H01L 21/28282; H01L 29/66833; H01L 27/1157; H01L 27/11529; H01L 29/408; H01L 29/792; G11C 16/0466; G11C 11/5621; G11C 11/5671
USPC ........ 438/201, 211, 216, 261, 288; 257/315, 257/324, 411
See application file for complete search history.

(56) References Cited

U.S. PATENT DOCUMENTS

| | | |
|---|---|---|
| 4,870,470 A | 9/1989 | Bass, Jr. et al. |
| 5,717,237 A | 2/1998 | Chi |
| 5,753,952 A | 5/1998 | Mehrad |
| 7,759,719 B2 | 7/2010 | Wang |
| 8,169,835 B2 | 5/2012 | Liao et al. |
| 8,343,840 B2 | 1/2013 | Lai et al. |
| 8,431,984 B2 | 4/2013 | Park et al. |
| 8,503,229 B2 | 8/2013 | Lee et al. |
| 9,401,434 B2 | 7/2016 | Chen et al. |

(Continued)

OTHER PUBLICATIONS

International Search Report & The Written Opinion of the International Searching Authority dated Dec. 1, 2017, International Application No. PCT/US2017/050868.

*Primary Examiner* — Hsien Ming Lee
(74) *Attorney, Agent, or Firm* — Vierra Magen Marcus LLP

(57) ABSTRACT

Disclosed herein is a non-volatile storage system with memory cells having a charge storage region that may be configured to store a higher density of charges (e.g., electrons) in the middle than nearer to the control gate or channel. The charge storage region has a middle charge storage material that stores a higher density of charges than two outer charge storage materials that are nearer to the control gate or channel, in one aspect. The charge storage region of one aspect has oxide regions between the middle charge storage material and the two outer charge storage materials. The oxide regions of one embodiment are thin (e.g., less than one nanometer) such that during operation charges may easily pass through the oxide regions. The non-volatile memory cell programs quickly and has high data retention.

16 Claims, 17 Drawing Sheets

(56) References Cited

U.S. PATENT DOCUMENTS

| | | |
|---|---|---|
| 9,449,985 B1 | 9/2016 | Rabkin et al. |
| 2006/0261401 A1 | 11/2006 | Bhattacharyya |
| 2008/0067577 A1* | 3/2008 | Wang .................. G11C 11/5671 257/321 |
| 2009/0014774 A1 | 1/2009 | Ono |
| 2009/0302365 A1 | 12/2009 | Bhattacharyya |
| 2010/0059808 A1 | 3/2010 | Zheng et al. |
| 2013/0163340 A1 | 6/2013 | Dutta et al. |
| 2014/0252445 A1 | 9/2014 | Chen et al. |

* cited by examiner

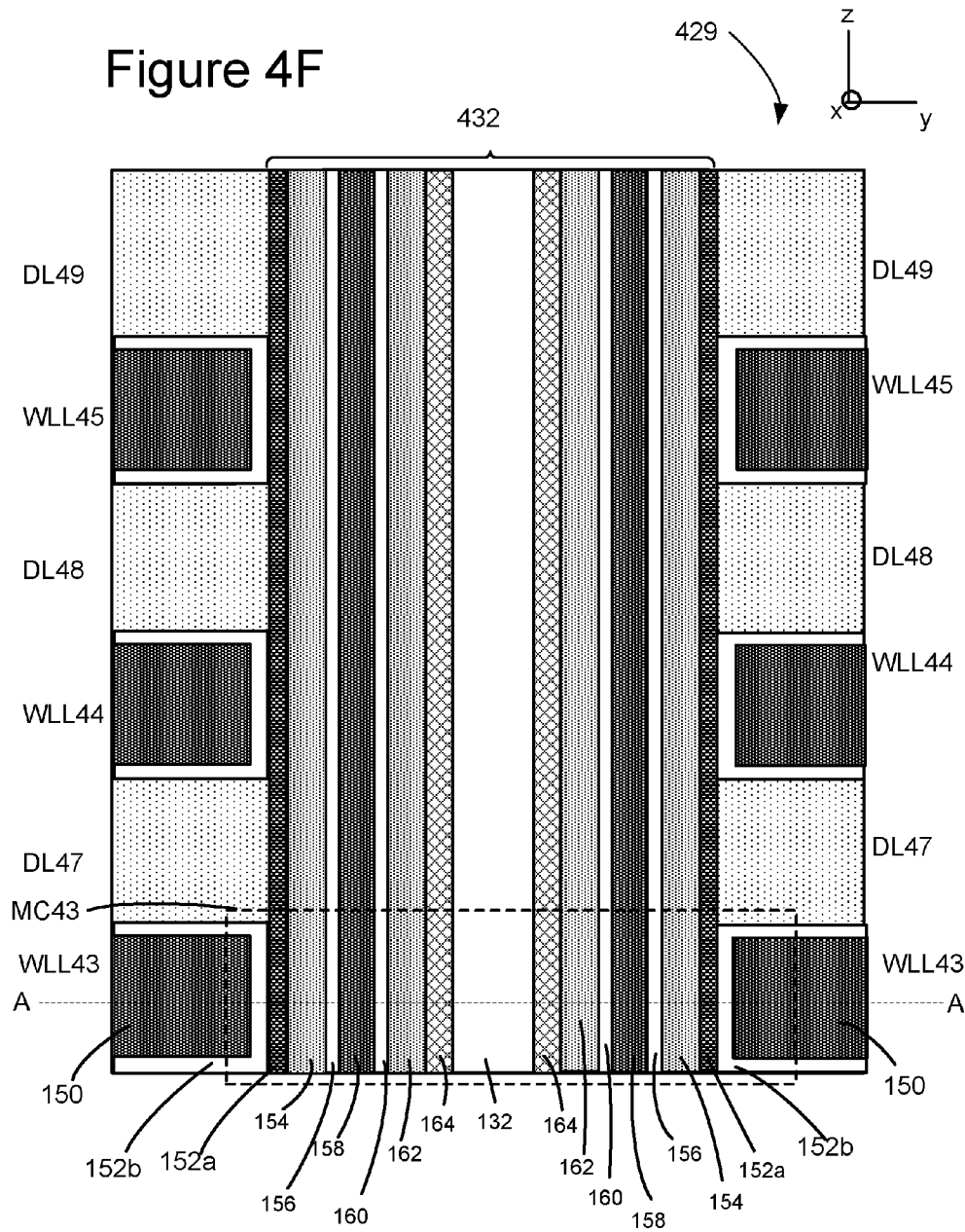

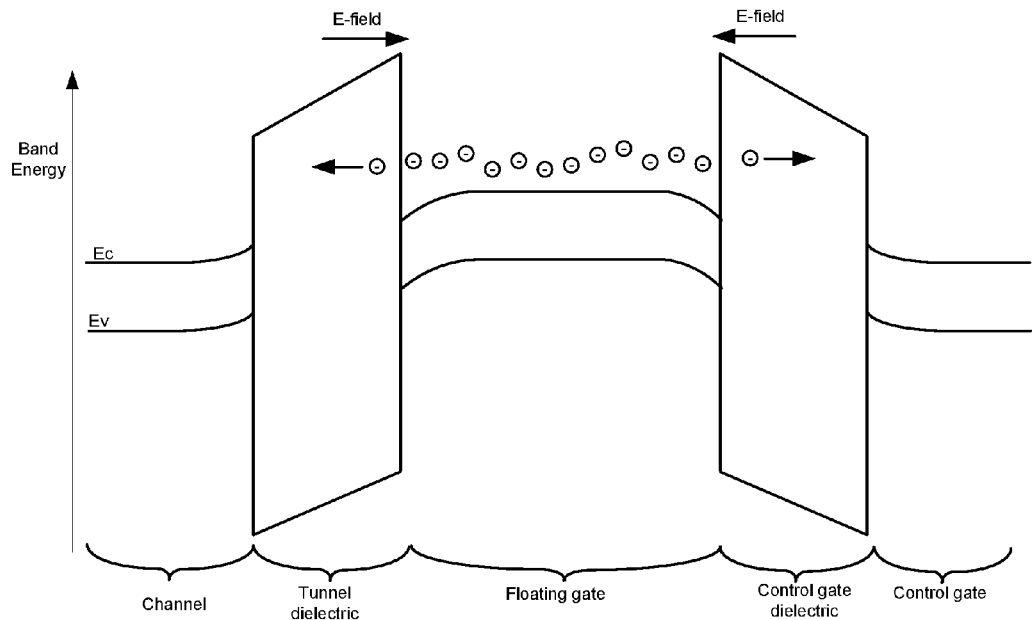
Fig. 5A (Conventional)
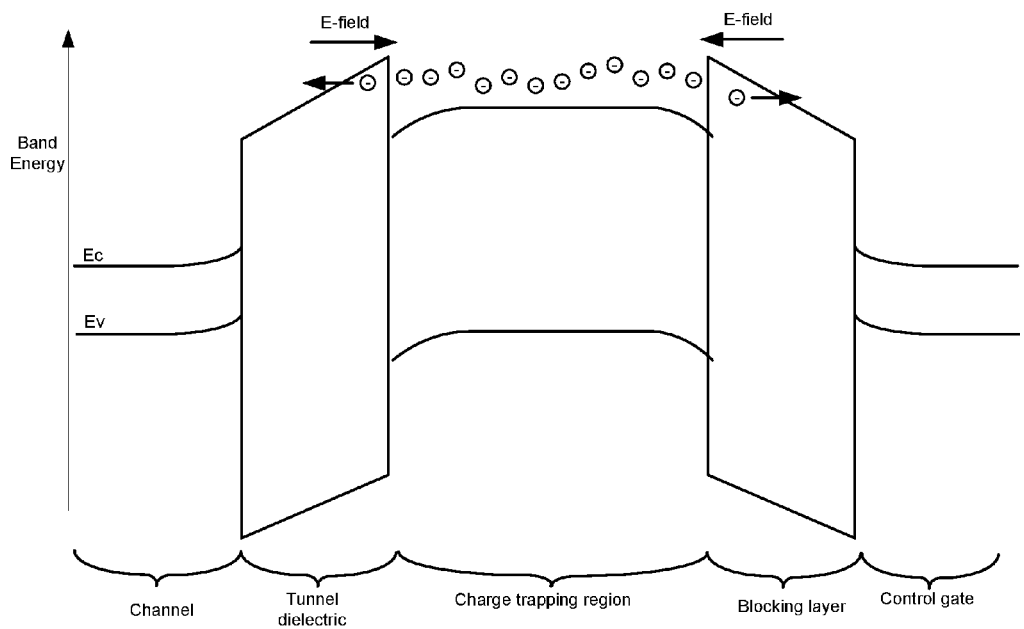
Fig. 5B (Conventional)

CHARGE STORAGE REGION IN NON-VOLATILE MEMORY

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory cells store information in a charge storage region. Examples of charge storage regions include a conductive floating gate and a charge trapping region. As one example, a conductive floating gate is located between a conductive control gate and a channel region. Moreover, the floating gate is insulated from the conductive control gate and the channel region. As another example, a charge trapping region is located between a conductive control gate and a channel region.

A non-volatile memory cell can function as a transistor, with the threshold voltage of the transistor controlled by the amount of charge that is retained in the charge storage region. That is, the minimum amount of voltage that must be applied to the control gate before the transistor is turned on to make the channel region conductive may be controlled by the amount of charge in the charge storage region.

Data may be stored in a non-volatile memory cell by establishing its threshold voltage within a target range. Prior to programming certain non-volatile memory devices, such as a NAND flash memory device, the memory cells are erased. The erase operation removes electrons from the charge storage region, for some devices. Thus, the erase may lower the threshold voltage of the memory cell. Programming of the memory cells may be achieved by applying a program voltage to the control gate to raise the threshold voltage of the memory cell. Raising the threshold voltage occurs as a result of adding electrons to the charge storage region, for some devices.

BRIEF DESCRIPTION OF THE DRAWINGS

Like-numbered elements refer to common components in the different figures.

FIG. 4F depicts a close-up view of one embodiment of region 429 of FIG. 4E.

FIG. 5A is an energy band diagram for a conventional floating gate memory cell at steady state.

FIG. 5B is an energy band diagram for a conventional charge trap memory cell at steady state.

DETAILED DESCRIPTION

Disclosed herein is a non-volatile storage system with memory cells having a charge storage region. The non-volatile storage system is 2D NAND, in one embodiment. The non-volatile storage system is 3D NAND, in one embodiment. The charge storage region of one embodiment is configured to store a higher density of charges (e.g., electrons) in the middle than nearer to the control gate or channel. The charge storage region has a middle charge storage material that stores a higher density of charges than two outer charge storage materials that are nearer to the control gate or channel, in one embodiment. The charge storage region of one embodiment has oxide regions between the middle charge storage material and the two outer charge storage materials. The oxide regions of one embodiment are thin (e.g., less than one nanometer) such that during operation charges may easily pass through the oxide regions.

A non-volatile memory cell of one embodiment can be programmed quickly. The time it takes to program the non-volatile memory is impacted by the ability to store charges (e.g., electrons) in the charge storage region (e.g., floating gate or charge trapping region). The non-volatile memory cell may be programmed by applying a voltage to its control gate, thereby causing electrons to move from the channel region towards the control gate, passing through the charge storage region. The charge storage region of one embodiment has a high electron capture rate. Therefore, programming speed is increased.

A non-volatile memory cell of one embodiment has high data retention. Over time, it is possible for charges (e.g., electrons) stored in the charge storage region to leave the charge storage region. For example, the electrons could migrate to the control gate or channel. Loss of electrons from the charge storage region impacts the threshold voltage of the memory cell transistor. The ability of a non-volatile memory cell to hold its charge therefore relates to its ability to retain data.

Figure 1A:
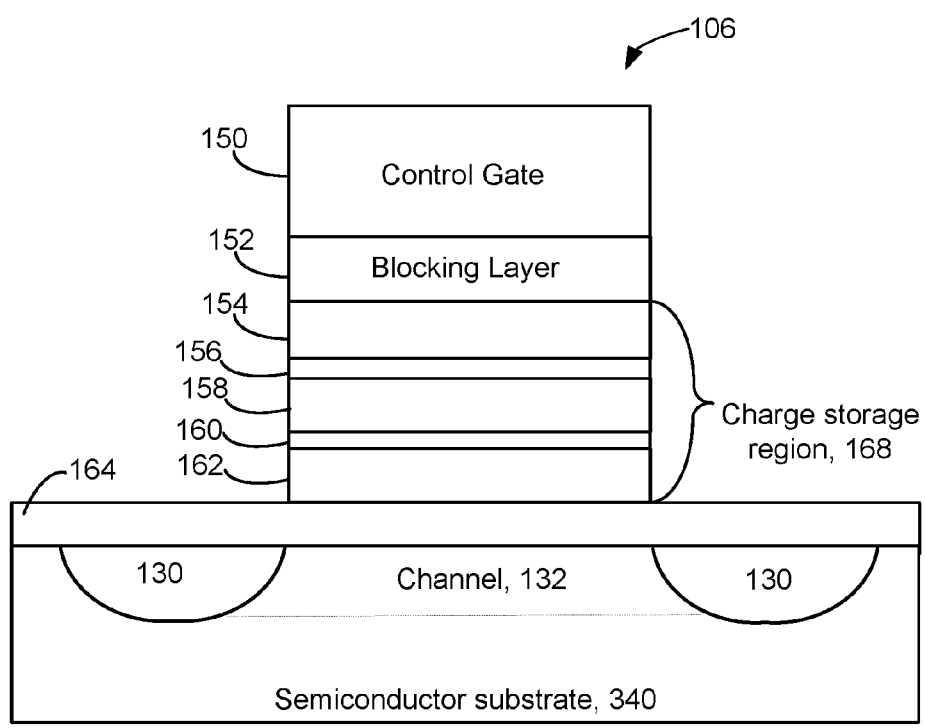
FIG. 1A is a diagram of one embodiment of a non-volatile memory cell having a charge storage region.

FIG. 1A is a diagram of one embodiment of a non-volatile memory cell 106 having a charge storage region. The memory cell 106 includes a control gate 150, blocking layer 152, charge storage region 168, tunnel dielectric 164, channel (e.g., semiconductor channel) 132, and source/drain regions 130. The semiconductor channel 132 and source/drain regions 130 are formed in a semiconductor substrate 340. The non-volatile memory cell 106 may operate as a transistor, and thus may be referred to as a "memory cell transistor". The memory cell transistor has a threshold voltage that depends on the amount of charge stored in the charge storage region 168.

The charge storage region 168 includes a first outer charge storage layer 162, a middle charge storage layer 158, a second outer charge storage layer 154, a first oxide 160 between the first outer charge storage layer 162 and the middle charge storage layer 158, and a second oxide 156 between the middle charge storage layer 158 and the second outer charge storage layer 154, in one embodiment. In one embodiment, the charge storage region 168 is a floating gate. In one embodiment, the charge storage region 168 is a charge trapping region.

The control gate 150 could be formed from metal or another conductive material such as heavily doped polysilicon. The memory cell has a blocking layer 152 between the charge storage region 168 and the control gate 150. The blocking layer 152 may also be referred to as a "blocking oxide" or as a "control gate dielectric." The blocking layer 152 may include one or more different dielectric materials. The blocking layer 152 comprises $Al_2O_3$ as a blocking layer, which blocks un-desirable tunneling of electrons from charge storage region 168 to control gate 150 or from control gate 150 to charge storage region 168, in one embodiment. The blocking layer 152 could instead of, or in addition to, the $Al_2O_3$ comprise a silicon oxide (e.g., $SiO_2$) layer. The blocking layer 152 is not limited to these example materials.

During operation, one of the two source/drain regions 130 may function as the source of the memory cell transistor, and the other as the drain of the memory cell transistor. A channel 132 is labeled between the two source/drain regions 130. As is well understood, during operation of a transistor, a conductive channel forms between the two source/drain regions 130. Herein, the term "channel" or the like refers to the semiconductor region in a memory cell transistor in which a conductive channel typically forms during operation. The semiconductor substrate 340 may be formed from various types of semiconductors, including but not limited to, silicon, germanium, or a III-V compound.

The tunnel dielectric 164 resides between the charge storage region 168 and the channel 132. The tunnel dielectric 164 may extend past the channel 132 such that it may also be present adjacent to the source/drain regions 130. Electrons can tunnel from the channel 132 to the charge storage region 168 during programming, in some embodiments. The tunnel dielectric 164 may include one or more different dielectric materials. In one embodiment, the tunnel dielectric 164 comprises a single layer of silicon oxide (e.g., $SiO_2$). In one embodiment, the tunnel dielectric 164 comprises a triple layer of silicon oxide (e.g., $SiO_2$), silicon nitride (e.g., $Si_3N_4$), and silicon oxide (e.g., $SiO_2$). The tunnel dielectric 164 is not limited to these example materials.

The first and second oxide layers 160, 156 are configured to pass electrons easily during operation, in some embodiments. In one embodiment, the first and second oxide layers 160, 156 are one nanometer or less in thickness (in the direction from the channel 132 to the control gate 150). In one embodiment, the charge storage layers 154, 158, 162 are about 20 nanometers in thickness (in the direction from the channel to the control gate). However, the charge storage layers 154, 158, 162 could be thicker or thinner.

In some embodiments, the charge storage region 168 stores a higher density of charges (e.g., electrons) in middle layer 158 than in outer layers 156 or 162. In other words, the charge storage region 168 may store a higher density of charges in the middle (with respect to the direction from channel 132 to control gate 150) than nearer to the channel 132 or control gate 150. For example, the middle charge storage layer 158 may be formed from a material that is configured to store a higher density of electrons than a material that forms the first outer charge storage layer 162. Likewise, this material that forms the middle charge storage layer 158 may be configured to store a higher density of electrons than a material that forms the second outer charge storage layer 154.

Figure 2A:
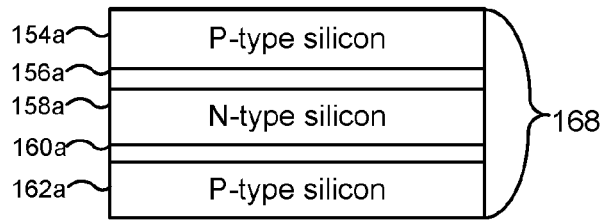
FIGS. 2A-2D depict various embodiments of a charge storage region, which may be used in the memory cell of FIG. 1A.

FIG. 2A depicts one embodiment of a charge storage region 168, which may be used in the memory cell of FIG. 1A. The first outer charge storage layer 162a is formed from p-type silicon, the middle charge storage layer 158a is formed from n-type silicon, and the second outer charge storage layer 154a is formed from p-type silicon. Each of these may be polycrystalline silicon. Note that for n-type silicon electrons are the majority carrier, whereas for p-type silicon electrons are the minority carrier. In the steady state, n-type silicon can hold more electrons than p-type silicon. Hence, it may be stated that n-type silicon is configured to store a higher density of electrons than p-type silicon. The first oxide 160a and the second oxide 156a are silicon oxide, in one embodiment.

Figure 2B:
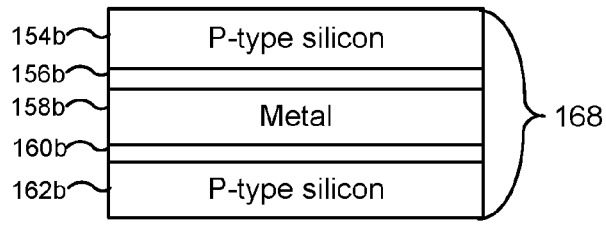

FIG. 2B depicts one embodiment of a charge storage region 168, which may be used in the memory cell of FIG. 1A. The first outer charge storage layer 162b is formed from p-type silicon, the middle charge storage layer 158b is formed from a metal, and the second outer charge storage layer 154b is formed from p-type silicon. Examples of the metal for the middle charge storage layer 158b include, but are not limited to titanium nitride (TiN) and tantalum nitride (TaN). This is another example in which the middle charge storage layer 158 is configured to store a store a higher density of electrons than either the first or second outer charge storage regions 162, 154. The first oxide 160b and the second oxide 156b are silicon oxide, in one embodiment.

In one embodiment, the middle charge storage layer 158 of the memory cell 106 depicted in FIG. 1A is formed from a material having a higher density of traps than the first outer charge storage layer 162. Likewise, this material that forms the middle charge storage layer 158 may have a higher density of traps than the material that forms the second outer charge storage layer 154. A greater density of traps allows for a greater density of charge storage. Hence, it may be stated that a material that has a higher density of traps is configured to store a higher density of electrons than one with a lower density of traps.

Figure 2C:
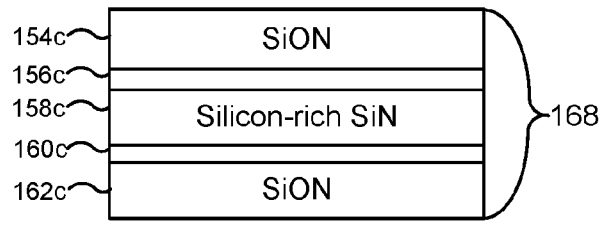

FIG. 2C depicts one embodiment of a charge storage region 168, which may be used in the memory cell of FIG. 1A. The charge storage material in the first outer charge storage layer 162c is silicon oxy-nitride, the charge storage material in the middle charge storage layer 158c is silicon-rich silicon nitride, and the charge storage material in the second outer charge storage layer 154c is silicon oxy-nitride. The silicon oxy-nitride in layers 162a and 154c is oxygen-rich SiON, in one embodiment. Silicon-rich silicon nitride is able to (or configured to) store a higher density of electrons than oxygen-rich silicon oxy-nitride. The first and second oxides 160c, 156c are silicon oxide, in one embodiment.

Herein, "silicon-rich" silicon nitride is defined as silicon nitride (SiN) having a silicon atomic concentration of greater than 43 percent. Note that silicon-rich silicon nitride has a higher trap density than stoichiometric silicon nitride (i.e., $Si_3N_4$). Hence, in one embodiment, the material in the middle charge storage layer 158 has a higher density of traps than stoichiometric silicon nitride ($Si_3N_4$).

Herein, "oxygen-rich" silicon oxy-nitride is defined as silicon oxy-nitride (SiON) having an oxygen atomic concentration between two to ten percent.

Figure 2D:
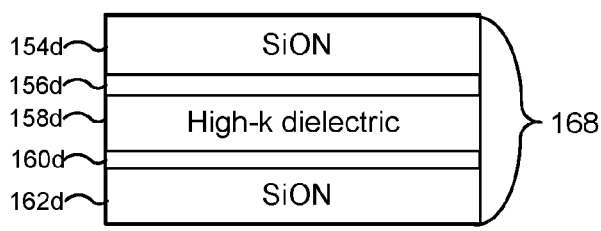

Other charge trapping materials can be used in the charge storage region 168 besides nitrides. FIG. 2D depicts one embodiment of a charge storage region 168, which may be used in the memory cell of FIG. 1A. In the embodiment of FIG. 2D, the middle charge storage layer 158d is formed from a high-k charge trapping material. Examples of high-k charge trapping materials include, but are not limited to, hafnium oxide (HfO), zirconium oxide (ZrO), and lanthanum oxide (LaO). In the embodiment of FIG. 2D, silicon oxy-nitride (SiON) is used for the first and second outer charge storage layers 162d, 154d with a high-k charge trapping material in the middle charge storage layer 158d. The first and second outer charge storage layers 162d, 154d may be oxygen-rich SiON. The first and second oxide layers 160d, 156d are silicon oxide, in one embodiment. The first and second oxides 160d, 156d are aluminum oxide, in one embodiment.

Figure 1B:
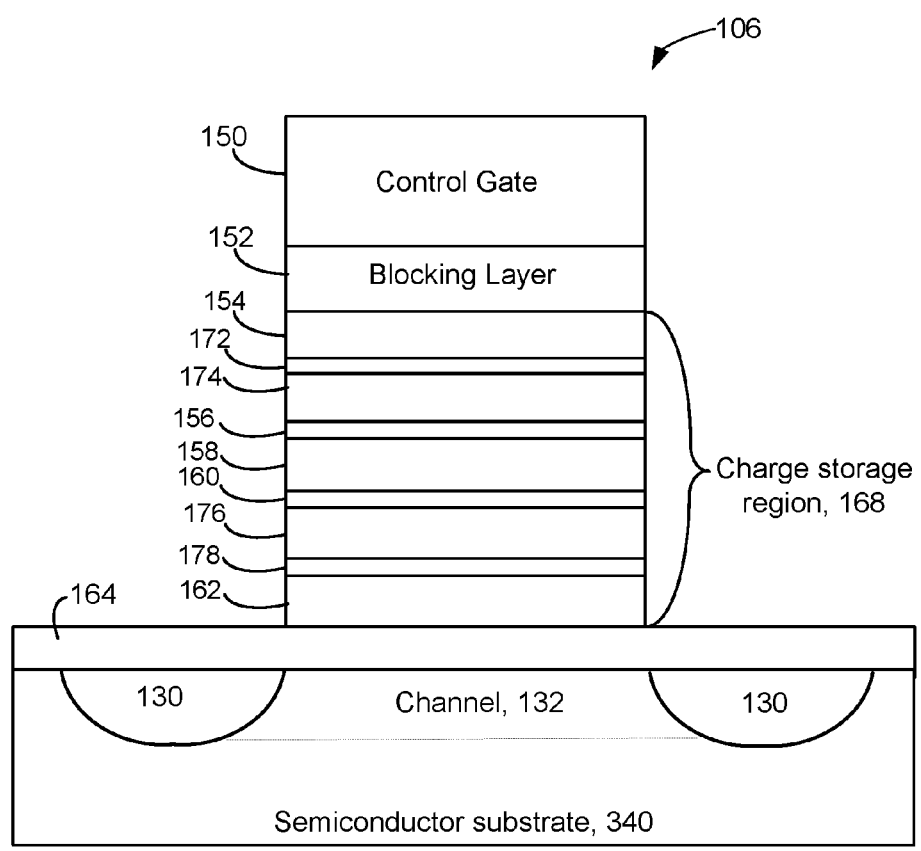
FIG. 1B is a diagram of another embodiment of a non-volatile memory cell having a charge storage region.

The charge storage region 168 is not limited to having three charge storage layers. FIG. 1B depicts another embodiment in which the charge storage region 168 has five charge storage layers 162, 176, 158, 174, and 154. Thus, first intermediate charge storage layer 176 and second intermediate charge storage layer 174 is added. The charge storage layer layers are separated by oxide layers 178, 160, 156, and 172. The oxide layers 178, 160, 156, and 172 are silicon oxide, in one embodiment. In one embodiment, the oxide layers 178, 160, 156, and 172 have a thickness of one nanometer or less.

In one embodiment, the charge storage region 168 of FIG. 1B is a charge trapping region. The charge storage layer 154 nearest the control gate 150 may be SiON or oxygen-rich SiON. Likewise, the charge storage layer 162 nearest the channel 132 may be SiON or oxygen-rich SiON. The middle charge storage layer 158 may be silicon-rich SiN. The intermediate charge storage layers 174, 176 may each be stoichiometric silicon nitride ($Si_3N_4$). Thus, the silicon ratio in the charge trapping layers may gradually be increased towards the middle layer 158. This concept may be extended to more than five charge trapping layers.

Figure 3A:
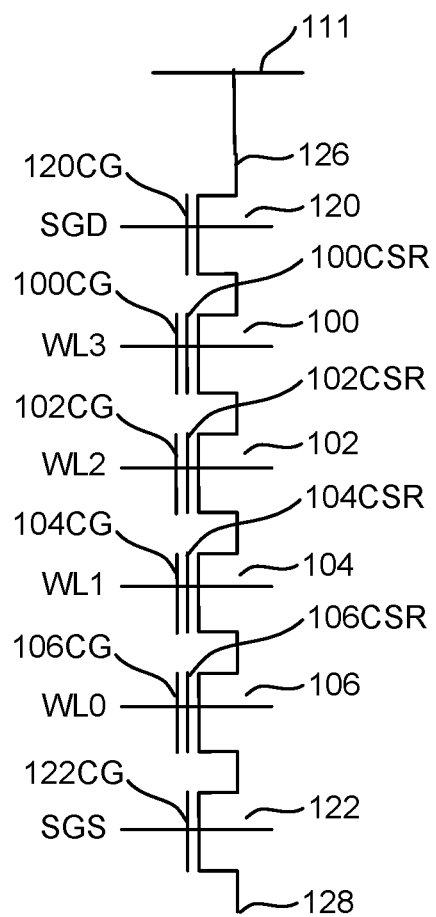
FIG. 3A is a circuit representation of a NAND string.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 3A is a circuit representation of a NAND string. The NAND string depicted in FIG. 3A includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128.

Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 100CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 3A shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

In some embodiments, each of the charge storage regions has the five layers 154, 156, 158, 160, 162 shown and described with respect to FIG. 1A. The charge storage region (100CSR, 102CSR, 104CSR, 106CSR) implemented with the charge storage region 168 of FIG. 2A, in one embodiment. The charge storage region (100CSR, 102CSR, 104CSR, 106CSR) implemented with the charge storage region 168 of FIG. 2B, in one embodiment. The charge storage region (100CSR, 102CSR, 104CSR, 106CSR) implemented with the charge storage region 168 of FIG. 2C, in one embodiment. The charge storage region (100CSR, 102CSR, 104CSR, 106CSR) implemented with the charge storage region 168 of FIG. 2D, in one embodiment. In one embodiment, each of the charge storage regions has the five charge trapping layers 154, 174, 158, 176, 162 shown and described with respect to FIG. 1B. Numerous types of materials can be used for the charge storage regions (CSR). In some embodiments, the charge storage regions are conductive floating gates. As one example, the conductive floating gate comprises polysilicon. This may be heavily doped polysilicon. In some embodiments, the charge storage regions comprise non-conductive dielectric materials to store charge in a non-volatile manner.

Figure 3B:
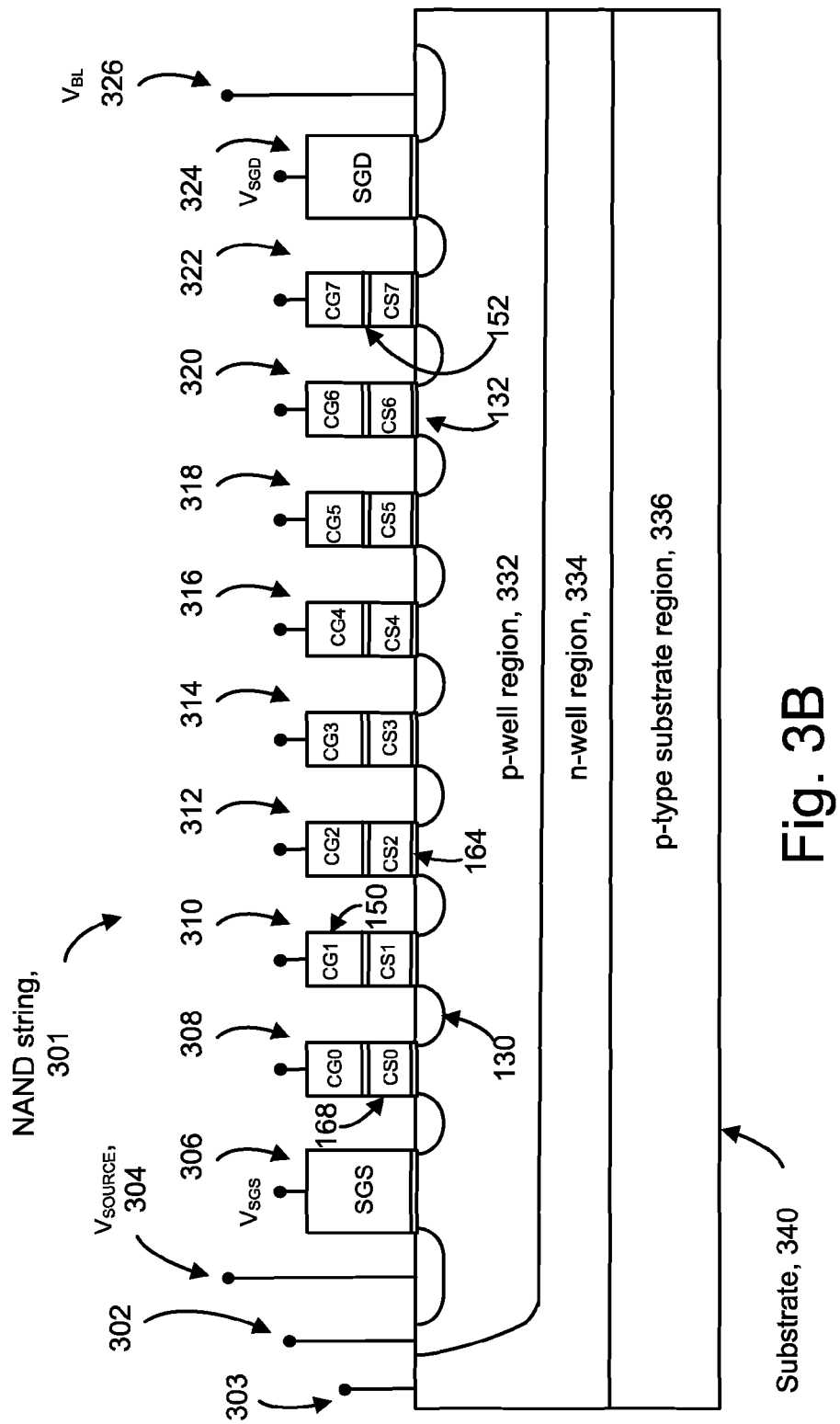
FIG. 3B depicts a cross-sectional view of a 2D NAND string formed on a semiconductor substrate.

One embodiment of the memory cell 106 of FIG. 1A is part of a 2D NAND string. Likewise, one embodiment of the memory cell 106 of FIG. 1B is part of a 2D NAND string. FIG. 3B depicts a cross-sectional view of a 2D NAND string formed on a semiconductor substrate. The view is simplified and not to scale. The 2D NAND string 301 includes a source-side select gate 306, a drain-side select gate 324, and eight non-volatile storage elements 308, 310, 312, 314, 316, 318, 320 and 322, formed on semiconductor substrate 340. A number of source/drain regions, one example of which is source/drain region 130, are provided on either side of each storage element and the select gates 306 and 324. Each of the memory cells in FIG. 3B may be implemented with the memory cell of FIG. 1A or 1B, but is not limited to those examples.

Each memory cell includes a charge storage region (CS0-CS7) and a control gate (CG0-CG7). Each charge storage region may comprise several dielectric layers (or films) in a stack between the tunnel dielectric and the control gate. The charge storage region (CS0-CS7) are one embodiment of charge storage region 168 of the memory cell of FIG. 1A. In one embodiment, each of the charge storage region (CS0-CS7) has the five regions 154, 156, 158, 160, 162 shown and described with respect to FIG. 1A. The various charge trap regions 168 shows and described with respect to FIGS. 2A-2D may be used in charge storage region (CS0-CS7). Numerous types of materials can be used for the charge storage regions (CS0-CS7). In one embodiment, the charge storage regions are conductive floating gates. As one example, the conductive floating gate comprises heavily doped polysilicon. In one embodiment, the charge storage regions comprise non-conductive dielectric materials to store charge in a non-volatile manner.

Each memory cell also has a tunnel dielectric 164 between the charge storage region and the semiconductor channel 132. The tunnel dielectric 164 may include one or more different dielectric materials. In one embodiment, the tunnel dielectric 164 comprises a single layer of silicon oxide (e.g., $SiO_2$). In one embodiment, the tunnel dielectric 164 comprises a triple layer of silicon oxide (e.g., $SiO_2$), silicon nitride (e.g., $Si_3N_4$), and silicon oxide (e.g., $SiO_2$). The tunnel dielectric is not limited to these example materials.

Each memory cell also has a control gate dielectric 152 between the charge storage region and the control gate. The control gate dielectric 152 may also be referred to as a "blocking oxide." The control gate dielectric 152 may include one or more different dielectric materials. The control gate dielectric 152 comprises alternating layers of silicon oxide and silicon nitride (e.g., silicon oxide/silicon nitride/silicon oxide or "ONO"), in one embodiment. The control gate dielectric 152 is not limited to these example materials.

The control gates could be formed from metal or another conductive material such as heavily doped polysilicon.

In one approach, the substrate 340 employs a triple-well technology which includes a p-well region 332 within an n-well region 334, which in turn is within a p-type substrate region 336. The 2D NAND string and its non-volatile storage elements can be formed, at least in part, on the p-well region.

A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. Voltages can be applied to the control gates of the memory cells during various operations (read, program, erase). $V_{SGS}$ and $V_{SGD}$ are applied to the select gates SGS 306 and SGD 324, respectively.

Figure 4A:
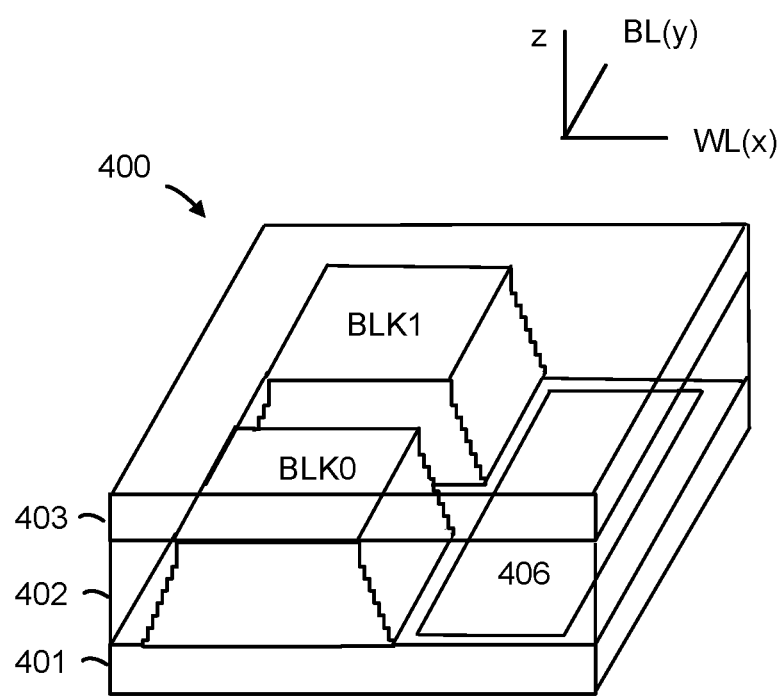
FIG. 4A is a perspective view of a 3D stacked non-volatile memory device.

One embodiment of the memory cell 106 of FIG. 1A resides in a 3D memory array. Likewise, one embodiment of the memory cell 106 of FIG. 1B resides in a 3D memory array. Also, the various charge storage regions 168 depicted in FIGS. 2A-2D may be used in memory cells that reside in a 3D memory array. FIG. 4A is a perspective view of a 3D stacked non-volatile memory device in which embodiments of charge storage regions 168 and memory cells 106 described herein may reside. The 3D memory device 400 includes a substrate 401. In one embodiment, the substrate 401 is formed from silicon. Thus, the substrate 401 may be a semiconductor substrate. In some embodiments, the substrate 401 is crystalline silicon. In some embodiments, the substrate 401 is single crystal silicon. The substrate 401 may be a semiconductor wafer. The substrate 401 has a major surface that extends in the x-y plane. On the substrate are example blocks BLK0 and BLK1 of memory cells and a peripheral area 406 with circuitry for use by the blocks. The substrate 401 can also carry circuitry under the blocks, along with one or more lower metal layers which are patterned in conductive paths to carry signals of the circuitry. The blocks are formed in an intermediate region 402 of the memory device. The circuitry associated with operation of the memory cells may be above or within the substrate 401. In one embodiment, the non-volatile memory device is monolithically formed in one or more physical levels of arrays of memory cells having an active area disposed above the substrate 401.

In an upper region 403 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 4B:
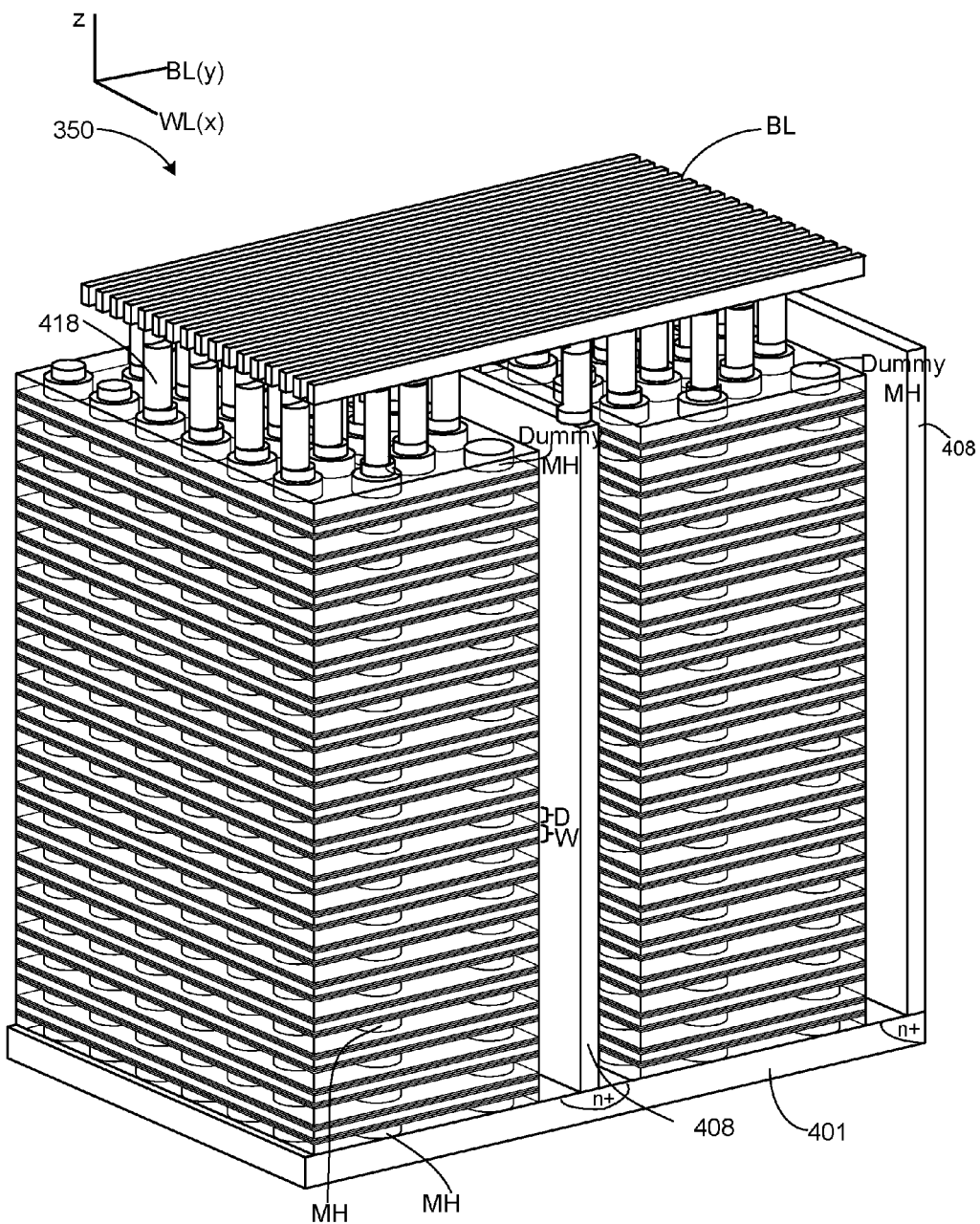
FIG. 4B is a perspective view of a portion of a three dimensional monolithic memory structure 350, which includes embodiments of memory cells.

FIG. 4B is a perspective view of a portion of a three dimensional monolithic memory structure 350, which includes a plurality memory cells. In one embodiment, the memory cells comprise a charge trapping region 168 as shown and descried with respect to FIGS. 1A, 1B, 2A, 2B, 2C and/or 2D. For example, the memory cells may have regions 154, 156, 158, 160, and 162, as shown and described with respect to FIG. 1A. The structure depicted includes a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 408. Note that the local source lines 408 may also be referred to as local interconnects LI. FIG. 4B only shows two fingers and two local interconnects LI. The local source lines 408 are conductive elements. Below and the alternating dielectric layers and word line layers is a substrate 401. Each local source line 408 is in electrical contact with an n+ diffusion region of the substrate 401.

Memory holes are formed in the stack of alternating dielectric layers and conductive layers. For example, one of the memory holes is marked as MH. Note that in FIG. 4B, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. Two of the memory holes, which are not used for data storage, are labeled as dummies (Dummy MH).

A number of bit lines (BL) are depicted over the top of the structure 350. Each bit line is connected to one of the memory holes (other than the Dummy MH) by a bit line contact 418.

Figure 4C:
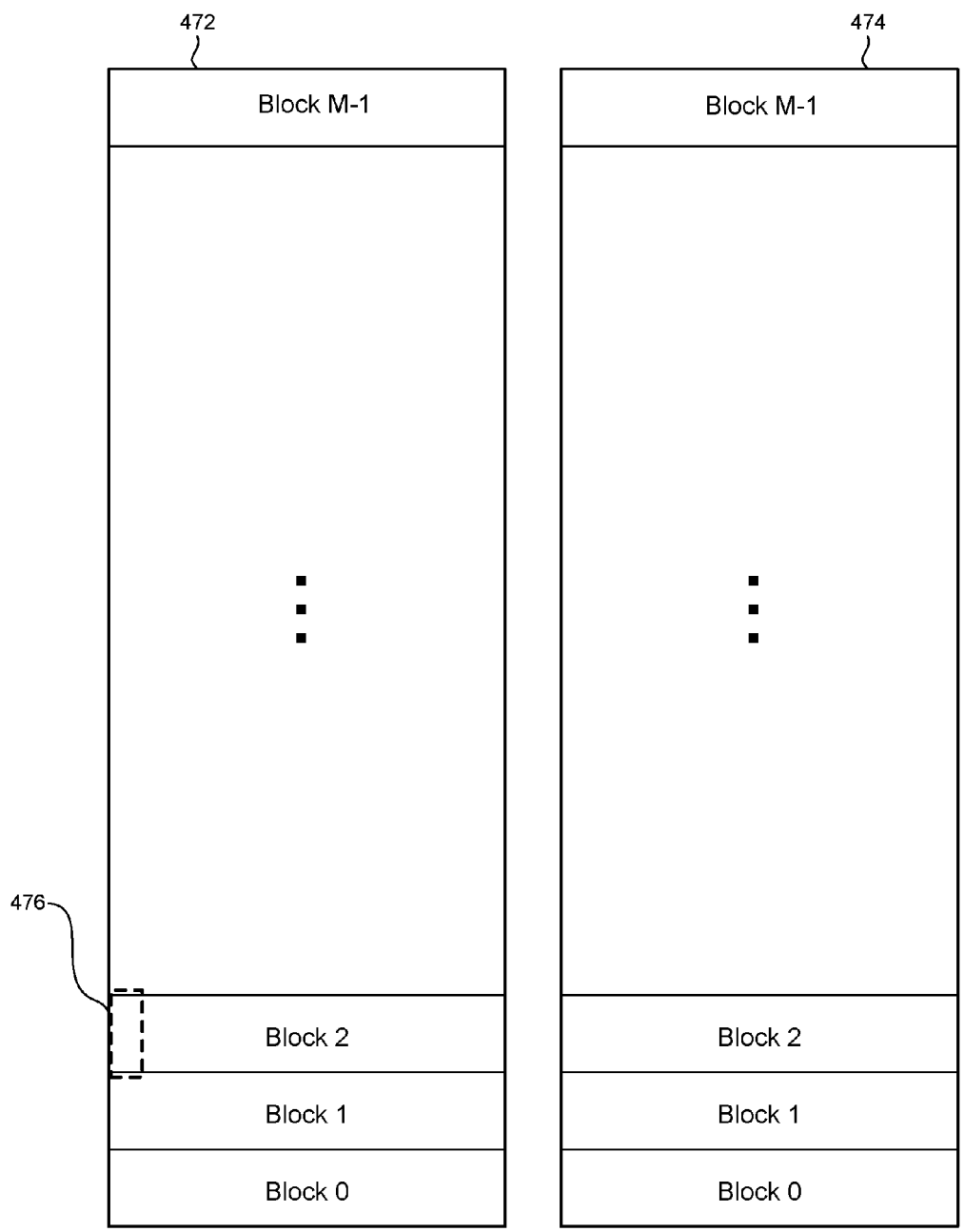
FIG. 4C is a block diagram explaining one example organization of memory structure 350 of FIG. 4B.

FIG. 4C is a block diagram explaining one example organization of memory structure 350, which is divided into two planes 472 and 474. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 472 includes block 0, 2, 4, 6, . . . and plane 474 includes blocks 1, 3, 5, 7, . . .

Figure 4D:
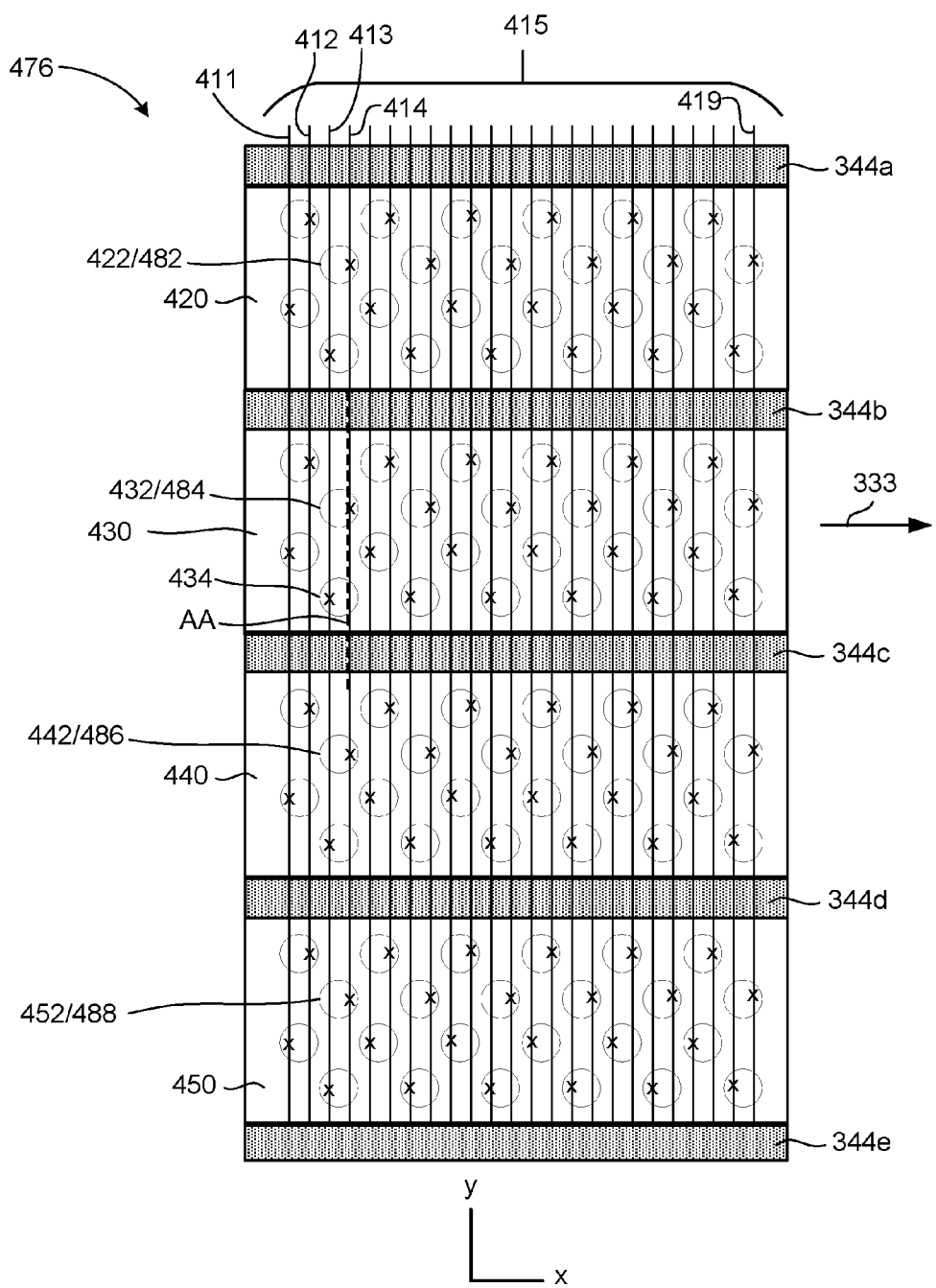
FIGS. 4D-4E depict an example 3D NAND structure.
Figure 4E:
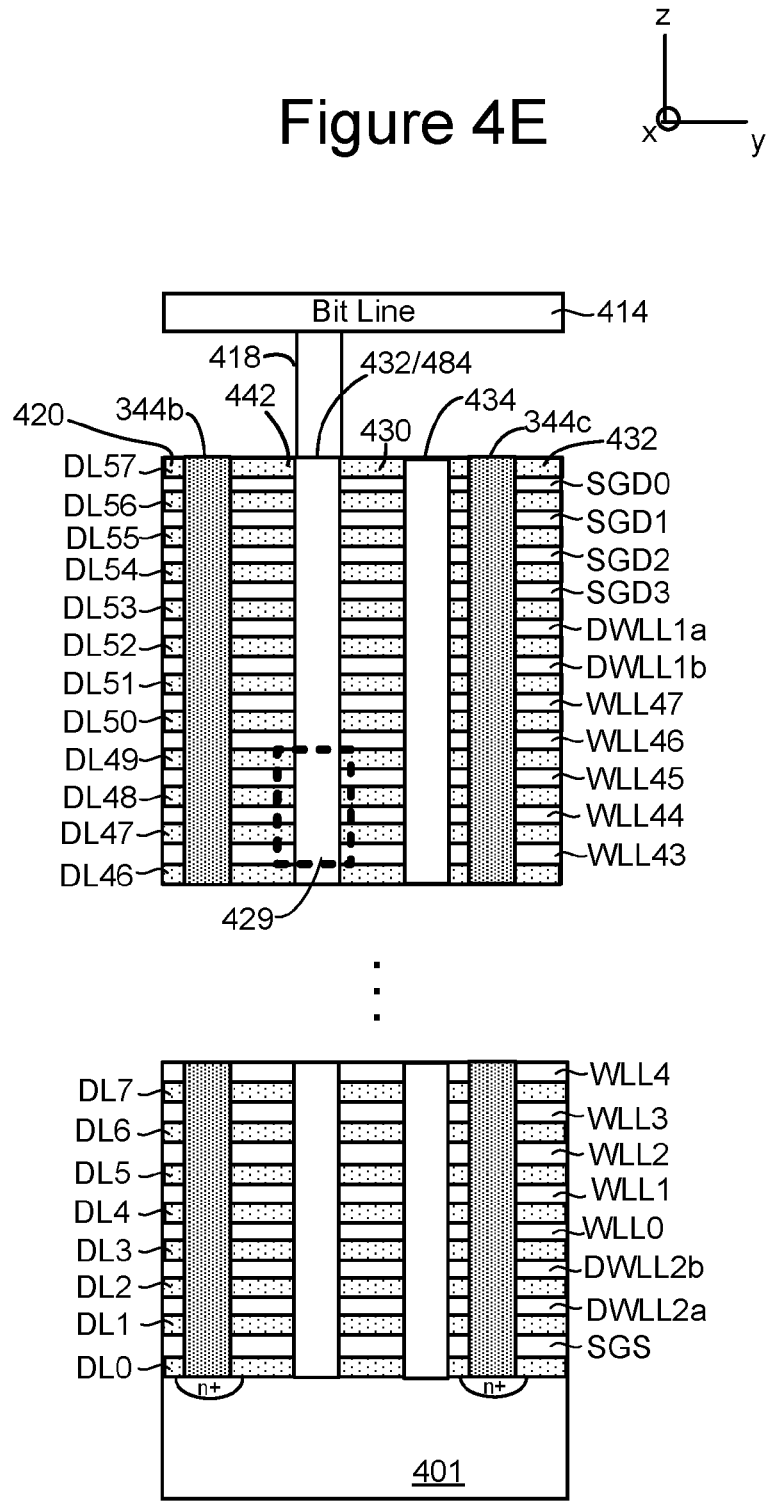

FIGS. 4D-4E depict an example 3D NAND structure. FIG. 4D is a block diagram depicting a top view of a portion of one block from memory structure 126. The portion of the block depicted in FIG. 4D corresponds to portion 476 in block 2 of FIG. 4C. As can be seen from FIG. 4D, the block depicted in FIG. 4C extends in direction of 333. In one embodiment, the memory array will have 60 layers. Other embodiments have less than or more than 60 layers. However, FIG. 4D only shows the top layer.

FIG. 4D depicts a plurality of circles that represent the vertical columns. Each of the vertical columns include multiple select transistors and multiple memory cells. In one embodiment, each vertical column implements a NAND string. For example, FIG. 4D depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4D extends in the direction of arrow 333, the block includes more vertical columns than depicted in FIG. 4D.

FIG. 4D also depicts a set of bit lines 415, including bit lines 411, 412, 413, 414, . . . 419. FIG. 4D shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4D includes a set of local source lines 344a, 344b, 344c, 344d, 344e. Local source lines may also be referred to as "local interconnects". Local interconnects 344 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4D shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4D also shows the vertical columns being staggered. In other embodiments, different patterns of staggering can be used. In some embodiments, the vertical columns are not staggered.

FIG. 4E depicts a portion of an embodiment of three dimensional memory structure 350 showing a cross-sectional view along line AA of FIG. 4D. This cross sectional view cuts through vertical columns 432 and 434 and region 430 (see FIG. 4D). The structure of FIG. 4E includes four drain side select layers SGD0, SGD1, SGD2 and SGD3; one source side select layer SGS; four dummy word line layers DWLL1a, DWLL1b, DWLL2a and DWLL2b; and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers). Vertical columns 432 and 434 are depicted protruding through the drain side select layers, source side select layer, dummy word line layers and word line layers. In one embodiment, each vertical column comprises a NAND string. For example, vertical column 432 comprises NAND string 484. Below the vertical columns and the layers listed below is crystalline silicon substrate 401. The substrate 401 is single crystal silicon, in some embodiments. The local source lines 344b, 344c are in direct electrical contact with an n+ region of the substrate 401, in this embodiment. The NAND string of vertical column 432 has a source end at a bottom of the stack and a drain end at a top of the stack. As in agreement with FIG. 4D, FIG. 4E show vertical column 432 connected to Bit Line 414 via bit line contact 418.

For ease of reference, drain side select layers SGD0, SGD1, SGD2 and SGD3; source side select layer SGS; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Alternating with the conductive layers are dielectric layers DL0-DL57. For example, dielectric layer DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. However, structurally dummy and data memory cells are the same, in some embodiments. Drain side select layers SGD0, SGD1, SGD2 and SGD3 are used to electrically connect and disconnect NAND strings from bit lines. Source side select layer SGS is used to electrically connect and disconnect NAND strings from the source lines 344b, 344c.

Figure 4G:
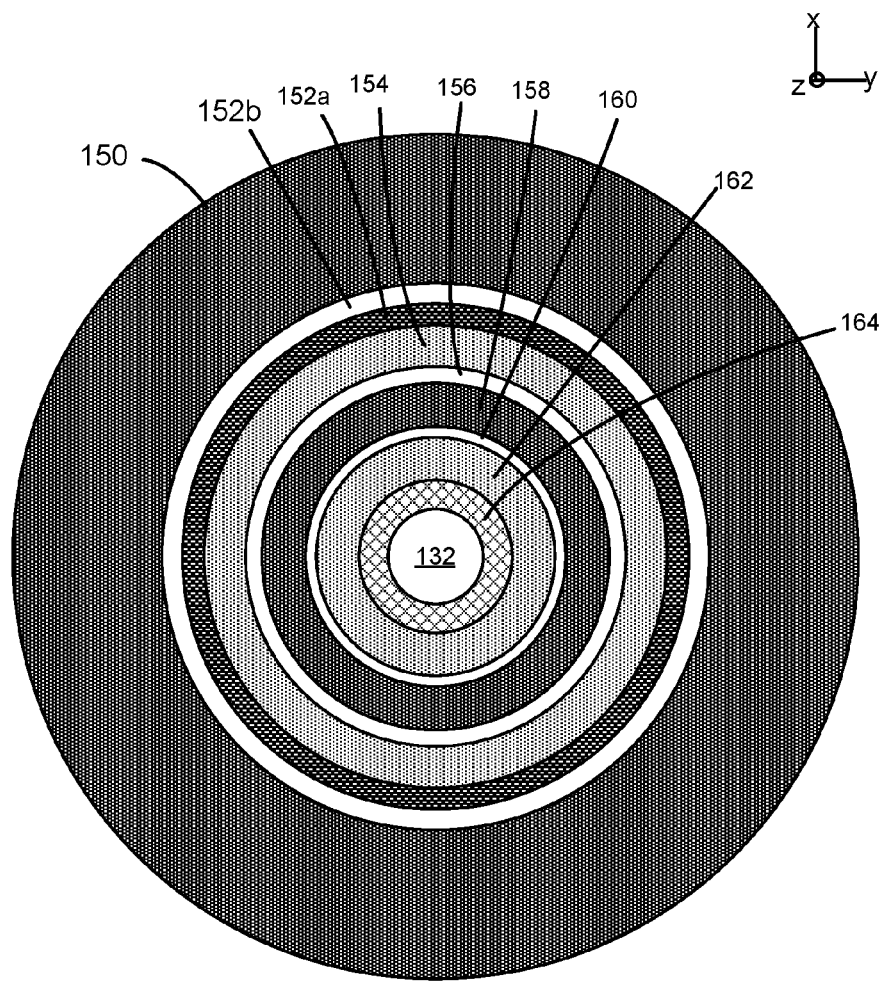
FIG. 4G depicts a horizontal cross section along line A-A' of FIG. 4F.

A region 429 of NAND string 484 is highlighted. FIG. 4F depicts a close-up view of one embodiment of region 429 of FIG. 4E, which includes column 432 of FIG. 4E. FIG. 4G depicts a horizontal cross section along line A-A' of FIG. 4F. In one embodiment, the vertical columns 432 are round in horizontal cross section; however, in other embodiments other shapes can be used. In one embodiment, the vertical column 432 comprises channel 132, tunneling dielectric 164, charge trapping layer 168 (comprising first outer charge trapping layer 162, first oxide layer 160, middle charge trapping layer 158, second oxide layer 156, and second outer charge trapping layer 154), and silicon oxide layer (e.g., $SiO_2$) 152a. Layer 152b is outside of the vertical column 432, but could alternatively be inside of the vertical column 432 adjacent to (e.g., surrounding) layer 152a. Layer 152b is aluminum oxide, in one embodiment. Together, layers 152a and 152b are one embodiment of a blocking layer 152.

Channel 132 is a semiconductor such as, silicon, SiGe, or a III-V type semiconductor. The vertical column 432 could also include inner core layer (not depicted) inside of semiconductor channel 132 that is made of a dielectric, such as $SiO_2$. In one embodiment, tunneling dielectric 164 has an ONO structure.

Together, layers 154, 156, 158, 160, and 162 form one embodiment of a charge storage region 168. In one embodiment, the charge storage region 168 is a charge trapping region. Layers 154, 156, and 158 are dielectric charge trapping materials in one embodiment. In this case, layer 162 may be referred to as a first outer charge trapping layer, layer 158 may be referred to as a middle charge trapping layer, and layer 154 may be referred to as a second outer charge trapping layer. Outer charge trapping layer 162 may be formed from silicon oxy-nitride (SiON). In one embodiment, outer charge trapping layer 162 is oxygen-rich SiON. In one embodiment, outer charge trapping layer 154 is formed from silicon oxy-nitride (SiON). In one embodiment, outer charge trapping layer 154 is oxygen-rich SiON. In one embodiment, layers 154c, 156c, 158c, 160c, and 162c as shown and described with respect to FIG. 2C are used in vertical column 432. In one embodiment, layers 154d, 156d, 158d, 160d, and 162d as shown and described with respect to FIG. 2D are used in vertical column 432. The vertical column 432 is not limited to the examples of FIGS. 2C-2D.

In one embodiment, the charge storage region 168 is a floating gate. In this case, layer 162 may be referred to as a first outer floating gate region, layer 158 may be referred to as a middle floating gate region, and layer 154 may be referred to as a second outer floating gate region. Layers 154, 156, and 158 are polysilicon, in one embodiment. In one embodiment, layers 154a, 156a, 158a, 160a, and 162a as shown and described with respect to FIG. 2A are used in vertical column 432. In one embodiment, layers 154b, 156b, 158b, 160b, and 162b as shown and described with respect to FIG. 2B are used in vertical column 432. The vertical column 432 is not limited to the examples of FIGS. 2A-2B.

FIG. 4F depicts dielectric layers DL47, DL48, and DL49, as well as layers WLL43, WLL44, and WLL45. The physical interaction of a word line layer (WLL43, WLL44, or WLL45) with the vertical column forms a memory cell. In FIG. 4F, memory cell MC43 is pointed out by a dashed box. Thus, a memory cell, in one embodiment, comprises channel 132, tunneling dielectric 164, charge storage region 168 (comprising first outer charge storage layer 162, first oxide layer 160, middle charge storage layer 158, second oxide layer 156, and second outer charge storage layer 154), silicon oxide layer (e.g., $SiO_2$) 152a, aluminum oxide layer 152b and control gate 150. Together, the aluminum oxide layer 152b and the silicon oxide layer 152a are one embodiment of a blocking layer 152. In other architectures, a memory cell may have a different structure; however, the memory cell would still be the storage unit.

When a memory cell is programmed, electrons are stored in a portion of the first outer charge storage layer 162, middle charge storage layer 158, and second outer charge storage layer 154 which is associated with the memory cell. These electrons are drawn into the charge storage region 168 from the channel 132, through the tunneling dielectric 164, in response to an appropriate voltage on control gate 150. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge storage layer to recombine with electrons. In one embodiment, erasing is achieved using hole injection into the charge storage layer via a physical mechanism such as gate induced drain leakage (GIDL).

FIG. 5A is an energy band diagram for a conventional floating gate memory cell. This is for a steady state with no voltage applied to the memory cell. From left to right, the diagram depicts a conduction band edge (Ec) and valence band edge (Ev) versus location for a channel, tunnel dielectric, floating gate, control gate dielectric, and control gate.

The floating gate region is depicted as storing electrons to represent that the floating gate has been programmed to hold some amount of charge. The E-field depicted near the boundary between the floating gate and the control gate dielectric is due, at least in part, to the electrons that are stored in the floating gate adjacent to the control gate dielectric. Likewise, the E-field depicted near the boundary between the floating gate and the tunnel dielectric is due, at least in part, to the electrons that are stored in the floating gate adjacent to the tunnel dielectric. These two E-fields may be referred to as "built-in" e-fields because they are present even with no external voltage applied to the control gate or substrate that contains the channel. These E-fields may result in charge loss from the floating gate. For example, the E-field at the control gate dielectric may pull electrons from floating gate towards the control gate. Also, the E-field at the tunnel dielectric may pull electrons from floating gate towards the channel. Therefore, these built-in E-fields may negatively impact data retention. When the concentration of charges (e.g., electrons) near the control gate dielectric (or alternatively near the tunnel dielectric) is higher, the built-in E-field becomes stronger. Hence, data retention becomes worse. Also note that when a greater number of electrons are stored on the floating gate (such as for memory cells programmed to a higher threshold voltage), the foregoing data retention problem is more severe.

FIG. 5B is an energy band diagram for a conventional charge trap memory cell. This is for a steady state with no voltage applied to the memory cell. From left to right, the diagram depicts a conduction band edge (Ec) and valence band edge (Ev) versus location for a channel, tunnel dielectric, charge trapping region, blocking layer, and control gate.

The charge trapping region is depicted as storing electrons to represent that the charge trapping region has been programmed to hold some amount of charge. The built-in E-field depicted near the boundary between the charge trapping region and the blocking layer is due, at least in part, to the electrons that are stored in the charge trapping region adjacent to the blocking layer. Likewise, the built-in E-field depicted near the boundary between the charge trapping region and the tunnel dielectric is due, at least in part, to the electrons that are stored in the charge trapping region adjacent to the tunnel dielectric. These built-in E-fields may result in charge loss from the charge trapping region in a similar manner as previously described with respect to the floating gate example of FIG. 5A.

Figure 6A:
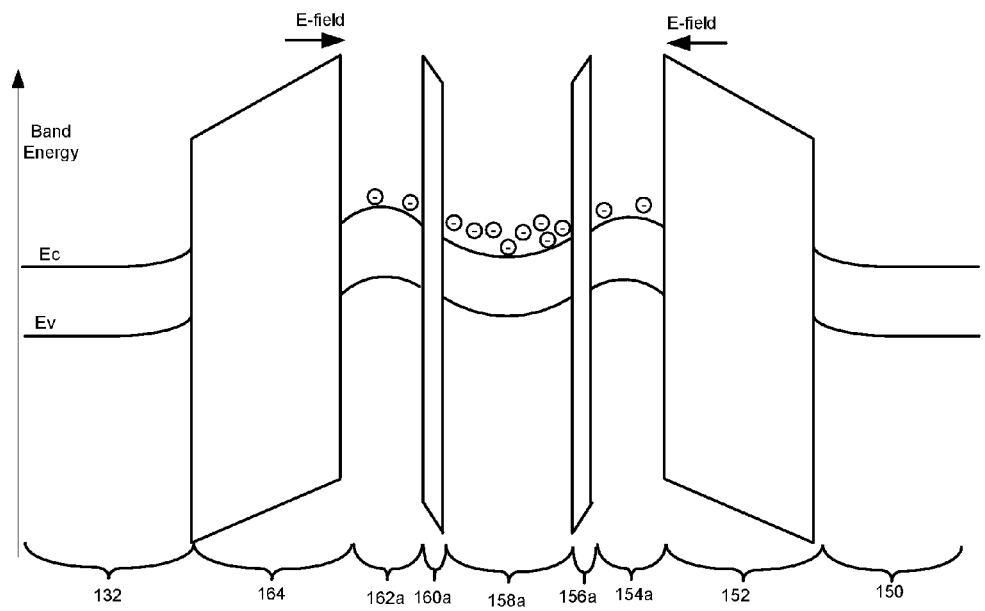
FIG. 6A is an energy band diagram for one embodiment of a floating gate memory cell at steady state.

FIG. 6A is an energy band diagram for one embodiment of a floating gate memory cell. This is for a steady state with no voltage applied to the memory cell. From left to right, the diagram depicts a conduction band edge (Ec) and valence band edge (Ev) versus location for a channel 132, tunnel dielectric 164, first outer charge storage layer 162a, first oxide 160a, middle charge storage layer 158a, second oxide 156a, second outer charge storage layer 154a, control gate dielectric 152, and control gate 150. Together, the second outer charge storage layer 154a, second oxide 156a, middle charge storage layer 158a, first oxide 160a, first outer charge storage layer 162a form the floating gate region, which is one example of a charge storage region. The floating gate region is consistent with the example of FIG. 2A.

The floating gate region is depicted as holding electrons to represent that the floating gate has been programmed to hold some amount of charge. Recall that that the first outer charge storage layer 162a is formed from p-type silicon, the middle charge storage layer 158a is formed from n-type silicon, and the second outer charge storage layer 154a is formed from p-type silicon, in this embodiment. The middle charge storage layer 158a has a greater density of electrons than either the second outer charge storage layer 154a or the first outer charge storage layer 162a, in this embodiment.

The E-field depicted near the boundary between the first outer charge storage layer 162a and the control gate dielectric 152 is due, at least in part, to the electrons that are stored in the second outer charge storage layer 154a adjacent to the control gate dielectric 152. Likewise, the E-field depicted near the boundary between the first outer charge storage layer 162a and the tunnel dielectric 164 is due, at least in part, to the electrons that are stored in the first outer charge storage layer 162a adjacent to the tunnel dielectric 164. These two E-fields may be referred to as "built-in" e-fields because they are present even with no external voltage applied to the control gate 150 or semiconductor body that contains the channel 132.

By having a lower density of electrons at the edge of the floating gate near the control gate dielectric 152, as well as the edge of the floating gate near the tunnel dielectric 164, the magnitude of these built in E-fields may be reduced relative to the conventional example of FIG. 5A. Note this pertains to a case in which the total charge stored in the floating gate is the same relative to the conventional example. In other words, by distributing the charge such that it is more concentrated near the middle of the floating gate, the magnitude of the built-in E-fields at the outer edges of the floating gate may be reduced. A smaller built-in E-field helps improve data retention.

For example, having a smaller magnitude E-field at the control gate dielectric 152 reduces the tendency to pull electrons from second outer charge storage layer 154a towards the control gate 150. Likewise, having a smaller magnitude E-field at the tunnel dielectric 164 reduces the tendency to pull electrons from first outer charge storage layer 162a towards the channel 132. Therefore, the reduction in the magnitude of the built-in E-fields may improve data retention.

Figure 6B:
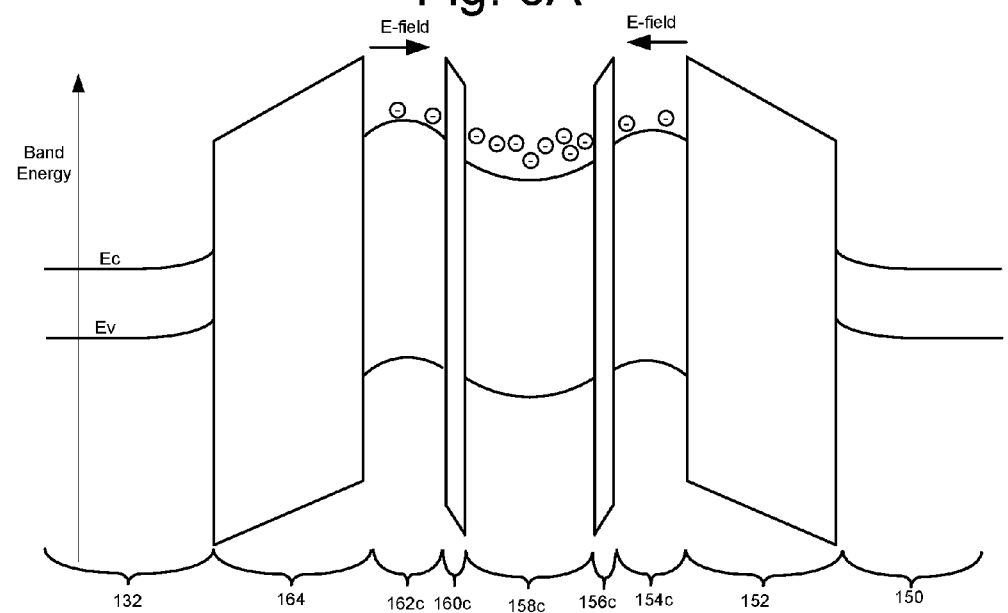
FIG. 6B is an energy band diagram for one embodiment of a charge trap memory cell at steady state.

FIG. 6B is an energy band diagram for one embodiment of a charge trap memory cell.

This is for a steady state with no voltage applied to the memory cell. From left to right, the diagram depicts a conduction band edge (Ec) and valence band edge (Ev) versus location for a channel 132, tunnel dielectric 164, first outer charge storage layer 162c, first oxide 160c, middle charge storage layer 158c, second oxide 156c, second outer charge storage layer 154c, control gate dielectric 152, and control gate 150. Together, first outer charge storage layer 162c, first oxide 160c, middle charge storage layer 158c, second oxide 156c, second outer charge storage layer 154c form the charge trapping region, which is one example of a charge storage region. The charge trapping region is consistent with the example of FIG. 2C.

The charge trapping region is depicted as holding electrons to represent that the charge trapping region has been programmed to hold some amount of charge. Recall that that the first outer charge storage layer 162c is formed from SiON, the middle charge storage layer 158c is formed from silicon-rich SiN, and the second outer charge storage layer 154c is formed from SiON, in this embodiment. The middle charge storage layer 158c has a greater density of electrons than either the second outer charge storage layer 154c or the first outer charge storage layer 162a, in this embodiment. In FIG. 6B, the first and second oxides 160d, 156d are silicon oxide.

The E-field depicted near the boundary between the second outer charge storage layer 154c and the control gate dielectric 152 is due, at least in part, to the electrons that are stored in the second outer charge storage layer 154c adjacent to the control gate dielectric 152. Likewise, the E-field depicted near the boundary between the first outer charge storage layer 162c and the tunnel dielectric 164 is due, at least in part, to the electrons that are stored in the first outer charge storage layer 162c adjacent to the tunnel dielectric 164. These two E-fields may be referred to as "built-in" e-fields because they are present even with no external voltage applied to the control gate 150 or semiconductor body that contains the channel 132.

By having a lower density of electrons at the edges of the charge trapping region near the control gate dielectric 152 and the tunnel dielectric 164, the magnitude of these built in E-fields may be reduced relative to the conventional example of FIG. 5B, for a case in which the total charge stored in the charge trapping region is the same. In other words, by distributing the charge such that it is more concentrated near the middle, the magnitude of the built-in E-fields at the edges may be reduced. A smaller built-in E-field helps improve data retention.

For example, having a smaller magnitude E-field at the control gate dielectric 152 reduces the tendency to pull electrons from second outer charge storage layer 154c towards the control gate 150. Likewise, having a smaller magnitude E-field at the tunnel dielectric 164 reduces the tendency to pull electrons from first outer charge storage layer 162c towards the channel 132. Therefore, the reduction in the magnitude of the built-in E-fields may improve data retention.

The principles discussed with respect to FIGS. 6A and 6B may be applied to other charge storage materials described herein. For example, the middle charge storage layer 158a of FIG. 6A can be formed from metal instead of n-type silicon, resulting a different energy band diagram. However, the built-in E-fields can still be reduced as a result of the p-type silicon in outer layers 154a and 162a. Likewise, the middle charge storage layer 158c of FIG. 6C can be formed from a high-k dielectric such as HfO, ZrO, or LaO instead of silicon-rich SiN, resulting a different energy band diagram. Also, the silicon oxide layers 156a, 160c might be replaced with aluminum oxide, resulting a different energy band diagram. However, the built-in E-fields can still be reduced as a result of the SiON (which may be oxygen-rich) in outer layers 154a and 162a.

Figure 7A:
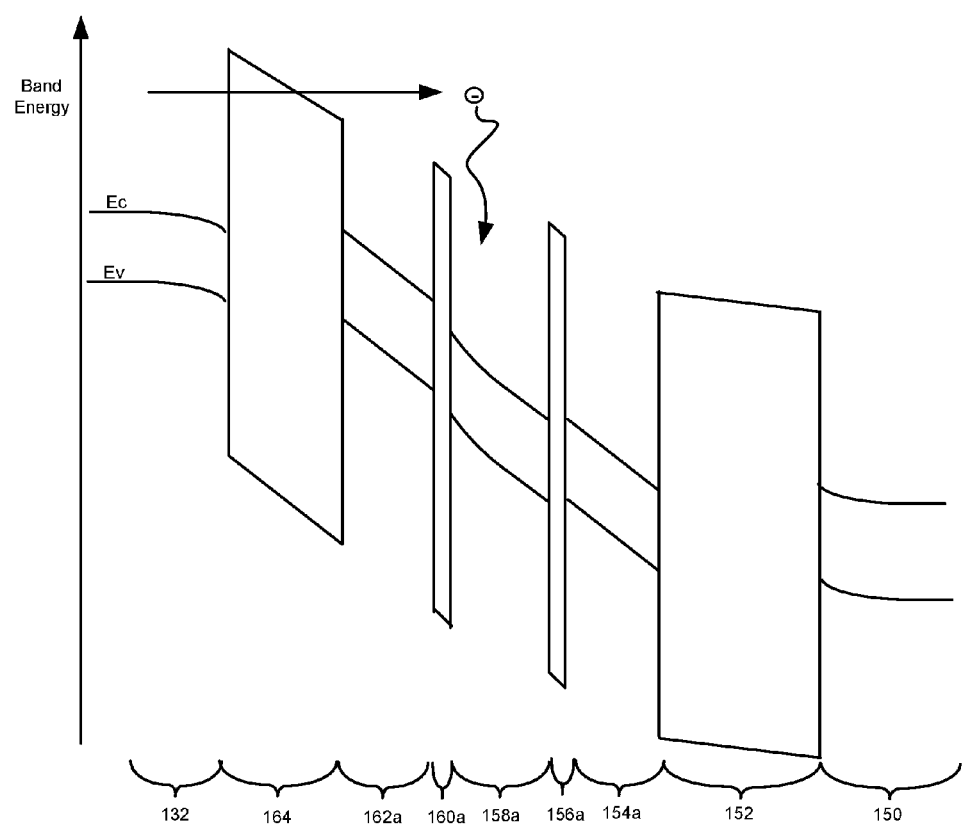
FIG. 7A is an energy band diagram for one embodiment of a floating gate memory cell during programming.

FIG. 7A is an energy band diagram for one embodiment of a floating gate memory cell during programming. The example is consistent with the example of FIG. 6A. The various layers in the floating gate may have different refractive indices. Also, the various layers in the floating gate may have different lattice structures. Either or both of these factors may increase scattering of electrons that move from the channel 132 through the floating gate towards the control gate 150. The increased scattering may increase capture rate. Thus, this embodiment of the floating gate memory cell can be programmed faster compared to a conventional floating gate memory cell (such as the example of FIG. 5A).

Figure 7B:
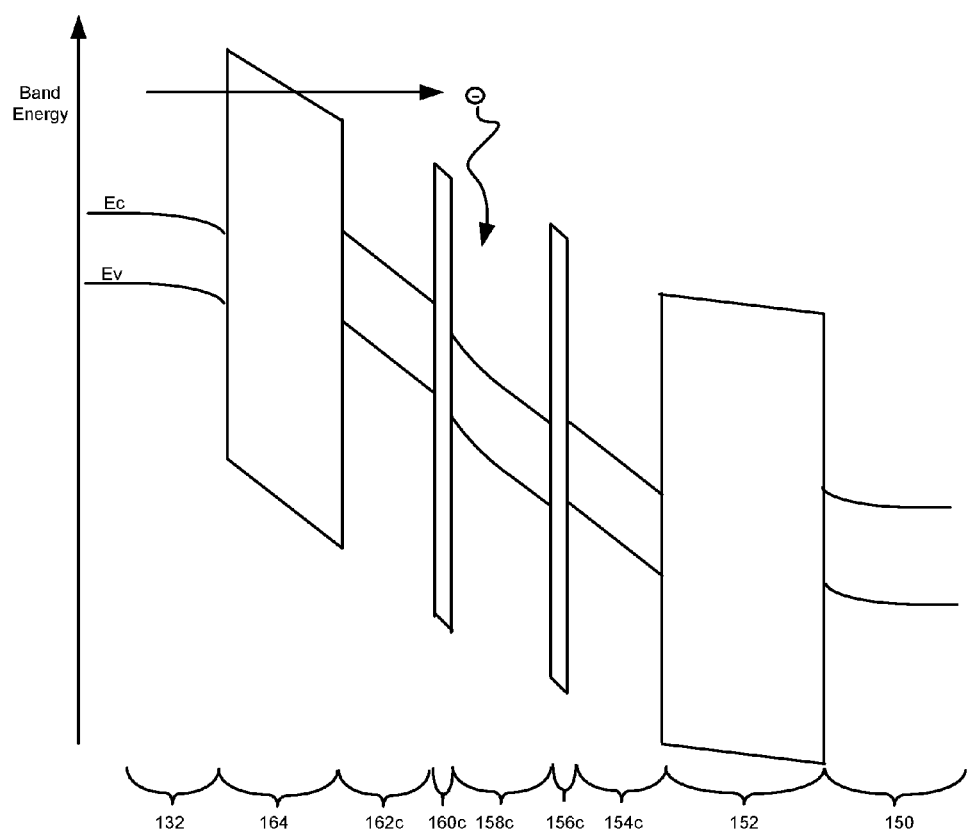
FIG. 7B is an energy band diagram for one embodiment of a charge trap memory cell during programming.

FIG. 7B is an energy band diagram for one embodiment of a charge trap memory cell during programming. The example is consistent with the example of FIG. 6B. The various layers in the charge trapping region may have different refractive indices. For example, the channel 132 may be silicon having a refractive index of about 3.44, the tunnel oxide 164 may include silicon oxide with a refractive index of about 1.46, the first and second outer charge trapping layers 162c, 154c may be formed from oxygen-rich SiON having a refractive index of about 1.84, the first and second oxide layers 160c, 156c may be formed from silicon oxide with a refractive index of about 1.46, and the middle charge storage layer 158c may be formed from silicon-rich SiN having a refractive index of about 2.24. The refractive indices may vary depending on the exact stoichiometry in the respective layers. Also, the various layers in the charge trapping region may have different lattice structures. Either or both of these factors may increase scattering of electrons that move from the channel 132 through the charge trapping region towards the control gate 150. The increased scattering may increase capture rate. Thus, the charge trapping memory cell can be programmed faster compared to a conventional charge trapping memory cell (such as the example of FIG. 5B).

Figure 8:
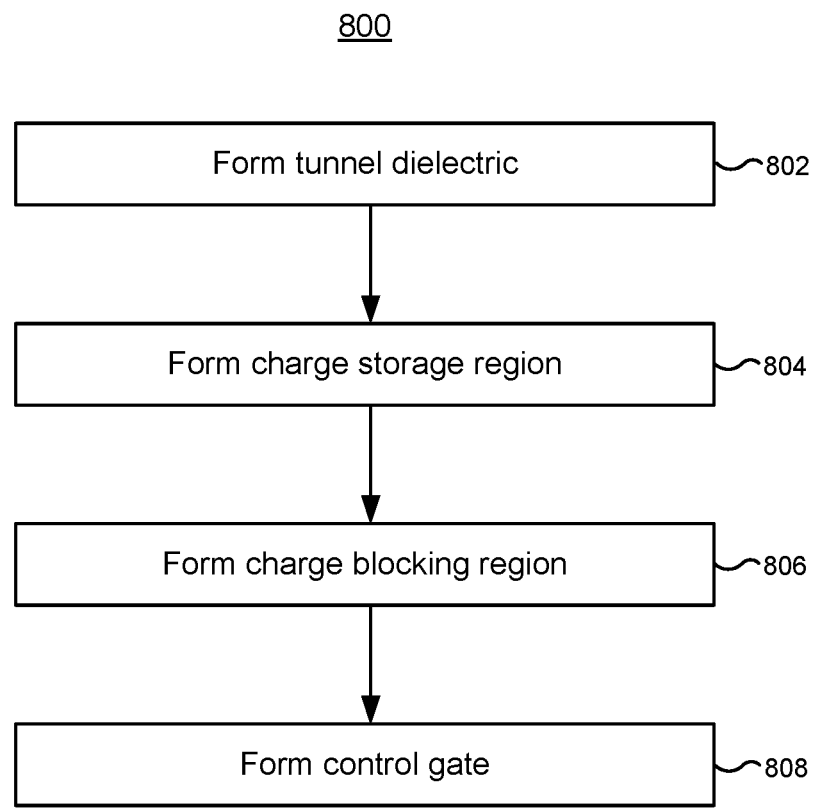
FIG. 8 is a flowchart of one embodiment of a process of fabricating a non-volatile storage element.

FIG. 8 is a flowchart of one embodiment of a process 800 of fabricating a non-volatile storage element. The non-volatile storage element may be fabricated in a 2D or 3D memory array. The non-volatile storage element may be part of a NAND string. The process 800 may be used to form memory cells including, but not limited to, those depicted in FIG. 1A, 1B, 3B, 4B, 4E, 4F, 4G. The memory cell may have a charge storage region including, but not limited to, those depicted in FIGS. 2A, 2B, 2C, 2D.

Step 802 includes forming a tunnel dielectric 164. The tunnel dielectric 164 may be formed adjacent to a semiconductor channel 132.

Step 804 includes forming a charge storage region 168 comprising: a first charge storage material 162 adjacent the tunnel dielectric, a second charge storage material 158, a third charge storage material 154, the second charge storage material being between the first and third charge storage materials, a first oxide 160 between the first charge storage material and the second charge storage material, a second oxide 156 between the second charge storage material and the third charge storage material. The second charge storage material is configured to store a higher density of charges than the first charge storage material. The second charge storage material configured to store a higher density of charges than the third charge storage material.

Step 806 includes forming a charge blocking region 152.

Step 806 includes forming a control gate 150. The charge blocking region 152 is located between the control gate 150 and the charge storage region 168. The charge storage region 168 is located between the tunnel dielectric 164 and the charge blocking region 152. The second charge storage material 154 located adjacent the charge blocking region 152.

A first embodiment includes a non-volatile storage element, comprising a tunnel dielectric a charge storage region, a control gate, and a charge blocking region located between the control gate and the charge storage region. The charge storage region comprises a first charge storage material adjacent the tunnel dielectric, a second charge storage material, and a third charge storage material. The second charge storage material resides between the first and third charge storage materials. The charge storage region further comprises a first oxide between the first charge storage material and the second charge storage material, and a second oxide between the second charge storage material and the third charge storage material. The second charge storage material is configured to store a higher density of charges than the first charge storage material. The second charge storage material is configured to store a higher density of charges than the third charge storage material. The charge blocking region resides between the control gate and the charge storage region. The charge storage region resides between the tunnel dielectric and the charge blocking region. The third charge storage material is adjacent to the charge blocking region.

In a second embodiment, in accordance with the first embodiment, the charge storage region is a floating gate.

In a third embodiment, in accordance with either the first or second embodiments, the first charge storage material is a p-type semiconductor, the second charge storage material is an n-type semiconductor, and the third charge storage material is a p-type semiconductor.

In a fourth embodiment, in accordance with either the first or second embodiments, the first charge storage material is a p-type semiconductor, the second charge storage material is a metal, and the third charge storage material is a p-type semiconductor.

In a fifth embodiment, in accordance with the first embodiment, the charge storage region is a charge trapping region.

In a sixth embodiment, in accordance with either the first embodiment or the fifth embodiment, the second charge storage material has a higher density of traps than the first charge storage material, the second charge storage material has a higher density of traps than the third charge storage material.

In a seventh embodiment, in accordance with any of the first, fifth, or sixth embodiments, the first charge storage material is silicon oxy-nitride, the second charge storage material is silicon-rich silicon nitride, and the third charge storage material is silicon oxy-nitride.

In an eighth embodiment, in accordance with any of the first through seventh embodiments, the first and second oxides are silicon oxide.

In a ninth embodiment, in accordance with any of the first through seventh embodiments, the first and second oxides are silicon oxide.

One embodiment includes a non-volatile memory system, comprising a plurality of NAND strings of non-volatile storage elements. Ones of the non-volatile storage elements comprise a tunnel dielectric, a floating gate a control gate, and a control gate dielectric between the control gate and the floating gate. The floating gate comprises a floating gate comprising: a first p-type silicon region adjacent the tunnel dielectric, a second p-type silicon region, an n-type silicon region between the first and second p-type silicon regions, a first dielectric region between the first p-type silicon region and the n-type silicon region, a second dielectric region between the n-type silicon region and the second p-type silicon region. The floating gate resides between the tunnel dielectric and the control gate dielectric. The second p-type silicon region is adjacent to the control gate dielectric.

One embodiment includes a non-volatile memory system, comprising a plurality of NAND strings of non-volatile storage elements. Ones of the of non-volatile storage elements comprise a dielectric region, a charge trapping region, a control gate, and a charge blocking region between the control gate and the charge trapping region. The charge trapping region comprises: a first charge trapping layer, a second charge trapping layer, and a third charge trapping layer. The second charge trapping layer resides between the first and second charge trapping layers. The charge trapping region further comprises a first oxide layer between the first charge trapping layer and the second charge trapping layer, and a second oxide layer between the second charge trapping layer and the third charge trapping layer. The second charge trapping layer has a higher density of traps than the first charge trapping layer. The second charge trapping layer has a higher density of traps than the third charge trapping layer. The third charge trapping layer is adjacent the charge blocking region.

As used herein, when an element, component or layer for example is described as being "on," "connected to," "coupled with," or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A non-volatile storage element, comprising:
   a tunnel dielectric;
   a charge storage region comprising: a first charge storage material adjacent the tunnel dielectric, a second charge storage material, a third charge storage material, the second charge storage material being between the first and third charge storage materials, a first oxide between the first charge storage material and the second charge storage material, a second oxide between the second charge storage material and the third charge storage material, the second charge storage material configured to store a higher density of charges than the first charge storage material, the second charge storage material configured to store a higher density of charges than the third charge storage material;
   a control gate; and
   a charge blocking region between the control gate and the charge storage region, the charge storage region being located between the tunnel dielectric and the charge blocking region, the third charge storage material being located adjacent to the charge blocking region.

2. The non-volatile storage element of claim 1, wherein the charge storage region is a floating gate.

3. The non-volatile storage element of claim 1, wherein the first charge storage material is a p-type semiconductor, the second charge storage material is an n-type semiconductor, and the third charge storage material is a p-type semiconductor.

4. The non-volatile storage element of claim 1, wherein the first charge storage material is a p-type semiconductor, the second charge storage material is a metal, and the third charge storage material is a p-type semiconductor.

5. The non-volatile storage element of claim 1, wherein the charge storage region is a charge trapping region.

6. The non-volatile storage element of claim 1, wherein the second charge storage material has a higher density of traps than the first charge storage material, the second charge storage material has a higher density of traps than the third charge storage material.

7. The non-volatile storage element of claim 1, wherein the first charge storage material is silicon oxy-nitride, the second charge storage material is silicon-rich silicon nitride, and the third charge storage material is silicon oxy-nitride.

8. The non-volatile storage element of claim 1, wherein the first and second oxides are silicon oxide.

9. The non-volatile storage element of claim 1, wherein the first and second oxides are aluminum oxide.

10. A non-volatile memory system, comprising:
    a plurality of NAND strings of non-volatile storage elements, ones of the of non-volatile storage elements comprising:
    a dielectric region;
    a charge trapping region comprising: a first charge trapping layer, a second charge trapping layer, a third charge trapping layer, the second charge trapping layer being between the first and third charge trapping layers, a first oxide layer between the first charge trapping layer and the second charge trapping layer, a second oxide layer between the second charge trapping layer and the third charge trapping layer, the second charge trapping layer having a higher density of traps than the first charge trapping layer, the second charge trapping layer having a higher density of traps than the third charge trapping layer;
    a control gate; and a charge blocking region between the control gate and the charge trapping region, the charge trapping region being between the dielectric region and the charge blocking region, the third charge trapping layer being adjacent the charge blocking region.

11. The non-volatile memory system of claim 10, wherein the first charge trapping layer is oxygen-rich silicon oxy-nitride, the third charge trapping layer is oxygen-rich silicon oxy-nitride.

12. The non-volatile memory system of claim 10, the second charge trapping layer is silicon-rich silicon nitride.

13. The non-volatile memory system of claim 10, wherein the second charge trapping layer is a high-k charge trapping material.

14. The non-volatile memory system of claim 10, wherein the first and second oxide layers are silicon oxide having a thickness in the direction from the dielectric region to the charge blocking region of one nanometer or less.

15. The non-volatile memory system of claim 10, wherein the first and second oxide layers are aluminum oxide.

16. The non-volatile memory system of claim 10, further comprising a three-dimensional memory array, wherein the plurality of NAND strings reside in the three-dimensional memory array.

* * * * *